(12) United States Patent
Shimoda

(10) Patent No.: US 6,809,599 B2
(45) Date of Patent: Oct. 26, 2004

(54) PHASE LOCKED LOOP CIRCUIT HAVING AUTOMATIC ADJUSTMENT FOR FREE-RUNNING FREQUENCY OF VOLTAGE CONTROLLED OSCILLATOR

(75) Inventor: Tetsuya Shimoda, Tokyo (JP)

(73) Assignee: Sony Corporation, Tokyo (JP)

( * ) Notice: Subject to any disclaimer, the term of this patent is extended or adjusted under 35 U.S.C. 154(b) by 54 days.

(21) Appl. No.: 10/315,463

(22) Filed: Dec. 10, 2002

(65) Prior Publication Data

US 2003/0210098 A1 Nov. 13, 2003

(30) Foreign Application Priority Data

Dec. 11, 2001 (JP) ........................................ 2001-376964

(51) Int. Cl.$^7$ .......................... H03L 7/085; H03L 7/087; G09G 5/00
(52) U.S. Cl. .............................. 331/17; 331/11; 331/25; 327/156; 345/204
(58) Field of Search .............................. 331/1 A, 10, 11, 331/16–18, 25; 327/156–159; 332/127; 345/204; 360/51; 375/376; 455/260

(56) References Cited

U.S. PATENT DOCUMENTS

| | | | | |
|---|---|---|---|---|
| 3,694,766 A | * | 9/1972 | Boelke | 331/11 |
| 3,883,817 A | * | 5/1975 | Cliff | 331/1 A |
| 4,513,448 A | * | 4/1985 | Maher | 455/265 |
| 4,847,569 A | * | 7/1989 | Dudziak et al. | 331/25 |
| 5,254,958 A | * | 10/1993 | Flach et al. | 331/10 |
| 6,518,845 B2 | * | 2/2003 | Nakamichi | 331/16 |

* cited by examiner

Primary Examiner—David Mis
(74) Attorney, Agent, or Firm—Frommer Lawrence & Haug LLP; William S. Frommer

(57) ABSTRACT

In a phase locked loop (PLL) circuit having a function of automatically adjusting the free-running frequency of a voltage controlled oscillator (VCO), the number of pulses of a pulse signal output from the VCO in a period in which a comparison signal output from a phase comparator is at a predetermined level is counted, and a microcomputer updates digital data based on the counted value. The digital data is converted into an analog signal by a digital-to-analog converter. A combiner combines the analog signal with a signal obtained by smoothing the comparison signal of the phase comparator by a low-pass filter so as to generate a frequency control signal of the VCO.

4 Claims, 3 Drawing Sheets

PHASE LOCKED LOOP CIRCUIT HAVING AUTOMATIC ADJUSTMENT FOR FREE-RUNNING FREQUENCY OF VOLTAGE CONTROLLED OSCILLATOR

BACKGROUND OF THE INVENTION

1. Field of the Invention

The present invention relates to a phase locked loop circuit having a function of automatically adjusting the free-running frequency of a voltage controlled oscillator.

2. Description of the Related Art

A phase locked loop (PLL) circuit including a phase comparator, a low-pass filter, and a voltage controlled oscillator (VCO), which are connected with each other into a loop, is used in a variety of applications. As an application, for use in displays, such as liquid crystal displays, organic electroluminescent (EL) displays, and plasma displays, such a PLL circuit is used for a display driving circuit of a display panel having pixels arranged into a dot matrix in order to generate a master clock based on a reference signal which is a horizontal synchronous signal or a vertical synchronous signal supplied from an external device.

A display driving circuit of such a display panel requires high accuracy and high stability master clock frequency. However, in the case where the frequency of the reference signal supplied to a PLL circuit from an external device greatly differs from the free-running frequency of a VCO in the PLL circuit, the output signal frequency of the VCO cannot be locked to the frequency of the reference signal unless the output signal frequency of the VCO is greatly shifted with respect to the free-running frequency of the VCO, thus impairing the stability of the output signal frequency of the VCO. This may not meet conditions requisite for the master clock of the display driving circuit. In a PLL circuit for generating a master clock of a display driving circuit, therefore, it is essential to adjust the free-running frequency of a VCO in the PLL circuit.

In the related art, a frequency counter for counting a master clock of a display driving circuit is used as an adjustment tool, which is connected to the display driving circuit in order to adjust the free-running frequency of a VCO. However, this mechanism has problems that such an adjustment tool is required and a time-consuming setting of connecting the adjustment tool to the display driving circuit is further required. Such a mechanism is also costly because the mechanism requires a checkout terminal for connecting the adjustment tool to the display driving circuit. In addition, the adjustment tool which is brought into contact with the checkout terminal causes a changing load of the master clock, leading to a measurement error.

The above-noted problems could be overcome by a PLL circuit having a function of automatically adjusting the free-running frequency of a VCO during operation of the PLL circuit. A PLL circuit having such a function is disclosed in Japanese Unexamined Patent Application Publication No. 2001-211072. In the PLL circuit disclosed in this publication, the output signal frequency of a VCO is converted into digital data by a frequency-to-data converter during operation of the PLL circuit, and the digital data is further converted into an analog signal by a digital-to-analog converter (DAC). The analog signal is added to a signal obtained by smoothing the output of a phase comparator by a low-pass filter, and the resulting signal is then input to the VCO as a frequency control signal, based on which the free-running frequency of the VCO is automatically adjusted.

In the PLL circuit disclosed in the publication, however, a high stability reference clock signal must be supplied to the frequency-to-data converter in order to activate the frequency-to-data converter. Thus, a circuit for generating such a reference clock signal is required, and, once the stability of the reference clock signal is reduced, the operation stability of the PLL circuit is also reduced.

SUMMARY OF THE INVENTION

Accordingly, it is an object of the present invention to provide a PLL circuit having an automatic adjustment for the free-running frequency of a VCO which does not require a circuit for generating a high stability reference clock signal, so that the operation stability of the PLL circuit can be maintained.

A phase locked loop circuit according to the present invention includes a voltage controlled oscillator having a control input terminal, a divide counter, a phase comparator, a counting unit, a data storing/updating unit, a digital-to-analog converter, a low-pass filter, and a combiner. The voltage controlled oscillator outputs a pulse signal having a frequency depending upon a frequency control signal supplied to the control input terminal. The divide counter divides the pulse signal received from the voltage controlled oscillator, and outputs the resulting pulse signal. The phase comparator receives as a first input signal a reference signal which is a pulse signal having a predetermined frequency supplied from an external unit, and receives as a second input signal the pulse signal output from the divide counter; and outputs a comparison signal. A period in which the comparison signal is at a predetermined level changes depending upon the phase difference between the first input signal and the second input signal. The counting unit counts the number of pulses of the pulse signal output from the voltage controlled oscillator in a period during which the comparison signal of the phase comparator is at the predetermined level. The data storing/updating unit updates stored digital data based on the count value of the counting unit. The digital-to-analog converter converts the digital data stored in the data storing/updating unit into an analog signal, and outputs the analog signal. The low-pass filter smoothes the comparison signal received from the phase comparator, and outputs the resulting signal. The combiner combines the output of the low-pass filter and the output of the digital-to-analog converter to generate a frequency control signal which is supplied to the control input terminal of the voltage controlled oscillator. The digital data is updated by the data storing/updating unit, thus allowing the free-running frequency of the voltage controlled oscillator to be automatically adjusted.

In a phase locked loop (PLL) circuit according to the present invention, therefore, the number of pulses of a pulse signal output from a voltage-controlled oscillator (VCO) in a period in which a comparison signal output from a phase comparator is at a predetermined level is counted, and digital data stored in a data storing/updating unit is updated based on the counted value. A digital-to-analog-converter (DAC) converts the digital data into an analog signal. A combiner combines the analog signal with a signal obtained by smoothing the comparison signal of the phase comparator by a low-pass filter to generate a frequency control signal of the VCO based on which the free-running frequency of the VCO is automatically adjusted. Since the PLL circuit of the present invention does not require a circuit for generating a high stability reference clock signal, the operation stability of the PLL circuit can be maintained. Thus, a PLL circuit having high accuracy and high stability is achieved.

DESCRIPTION OF THE PREFERRED EMBODIMENTS

An embodiment of the present invention is now described with reference to the drawings.

Figure 1:
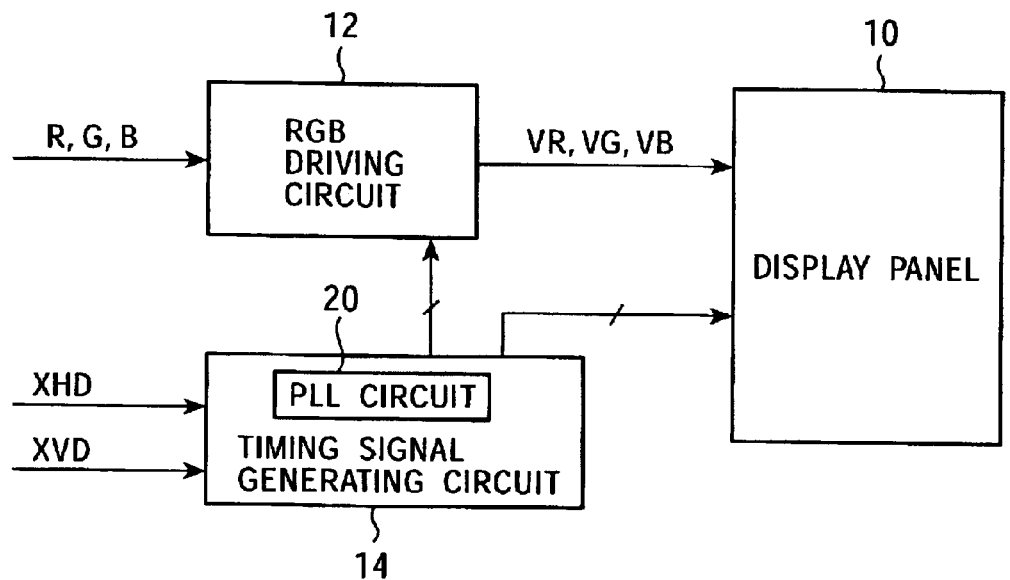
FIG. 1 is a block diagram of a display driving circuit of a display device using a PLL circuit according to the present invention.

In FIG. 1, a display panel 10 having pixels arranged into a dot matrix is used for display devices such as liquid crystal displays, organic electroluminescent (EL) displays, and plasma displays. A display driving circuit is implemented by an RGB driving circuit 12 and a timing signal generating circuit 14 which are connected with the display panel 10. The RGB driving circuit 12 processes video signals R, G, and B supplied from an external device so as to convert the video signals into video signals VR, VG, and VB, respectively, which are suitable for driving the pixels of the display panel 10. The timing signal generating circuit 14 generates a timing signal for driving the display panel 10 and the RGB driving circuit 12 based on a horizontal synchronous signal XHD and a vertical synchronous signal XVD supplied from an external device. The timing signal generating circuit 14 includes a PLL circuit 20 according to a preferred embodiment of the present invention, as described below. Based on the horizontal synchronous signal XHD received from an external device, the PLL circuit 20 generates a horizontal master clock HDO for driving the display panel 10 and the RGB driving circuit 12.

Figure 2:
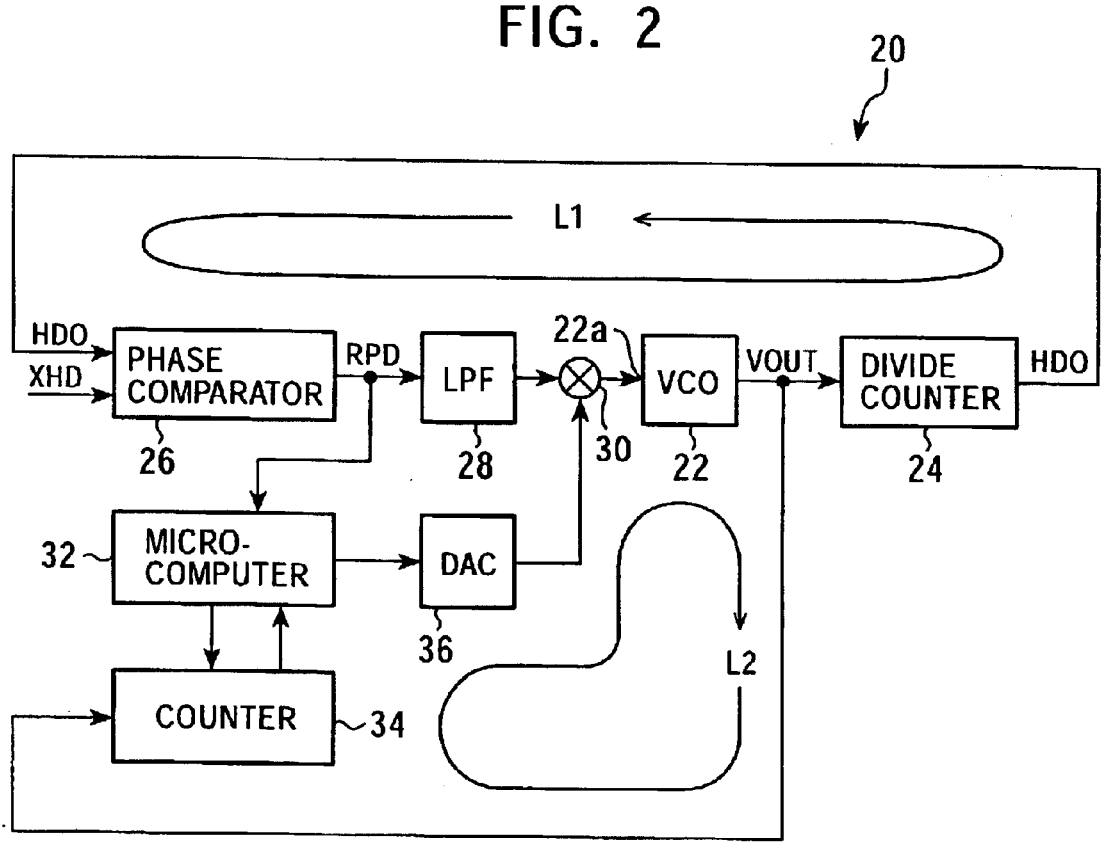
FIG. 2 is a block diagram of a PLL circuit according to a preferred embodiment of the present invention.

FIG. 2 is a block diagram showing the configuration of the PLL circuit 20 according to a preferred embodiment of the present invention. The PLL circuit 20 includes a voltage controlled oscillator (VCO) 22, a divide counter 24, a phase comparator 26, a low-pass filter (LPF) 28, and a combiner 30 for combining two signals, and these components form a first loop L1. The first loop L1 incorporates a divide counter and a combiner in addition to the basic structure of a typical PLL circuit having a loop of a VCO, a phase comparator, and an LPF. The functionality of the first loop L1 corresponds to the functionality of the loop of the typical PLL circuit.

The horizontal synchronous signal XHD is supplied to the phase comparator 26 from an external device. The horizontal synchronous signal XHD is a pulse signal having a predetermined frequency (for example, 15.734 kHz), and is a reference signal for causing the PLL circuit 20 to be locked to that frequency. The VCO 22 includes a control input terminal 22a, and outputs a pulse signal VOUT having a frequency depending upon a frequency control signal supplied to the control input terminal 22a. The divide counter 24 receives the pulse signal VOUT output from the VCO 22, and divides the received pulse signal to output a horizontal master clock HDO which is a pulse signal having a frequency substantially equal to the frequency of the horizontal synchronous signal XHD. The horizontal master clock HDO is supplied to the display panel 10 and the RGB driving circuit 12 shown in FIG. 1.

The phase comparator 26 receives the horizontal synchronous signal (reference signal) XHD, which is a pulse signal, as a first input signal, and receives the horizontal master clock HDO output from the divide counter 24, which is a pulse signal, as a second input signal. The phase comparator 26 then outputs a comparison signal RPD, and a period in which the comparison signal RPD is at a predetermined level varies depending upon the phase difference between the first input signal XHD and the second input signal HDO. The comparison signal RPD is described below in more detail. The LPF 28 receives the comparison signal RPD output from the phase comparator 26, and smoothes the received signal to output the result. The output of the LPF 28 is supplied to the combiner 30 as an input signal.

The PLL circuit 20 further includes a microcomputer 32, a counter 34, and a digital-to-analog converter (DAC) 36. These components in combination with the VCO 22 and the combiner 30 form a second loop L2. The second loop L2 has a function of automatically adjusting the free-running frequency of the VCO 22.

The microcomputer 32 controls the counting operation of the counter 34. The microcomputer 32 and the counter 34 serve as a counting unit for counting the number of pulses of the pulse signal VOUT output from the VCO 22 in a period where the comparison signal RPD of the phase comparator 26 is at a predetermined level (at negative potential −E in the illustrated embodiment). Although the counter 34 is separated from the microcomputer 32 in the illustrated embodiment, the microcomputer 32 may incorporate the functionality of the counter 34.

The microcomputer 32 has digital data DAC_DATA stored in an internal memory thereof, and updates the value of the digital data DAC_DATA according to the count value read from the counter 34. Thus, the microcomputer 32 serves as a data storing/updating unit for updating the stored digital data based on the count value of the counting unit. The up-to-date digital data DAC_DATA is constantly supplied to the DAC 36, and the DAC 36 converts the digital data DAC_DATA into an analog signal which is then output.

The output of the DAC 36 is supplied to the combiner 30 as an input signal. The combiner 30 combines the output of the LPF 28 and the output of the DAC 36 to generate a frequency control signal which is supplied to the control input terminal 22a of the VCO 22. More specifically, the combiner 30 adds the output of the LPF 28 to the output of the DAC 36 to combine the outputs.

Figure 3:
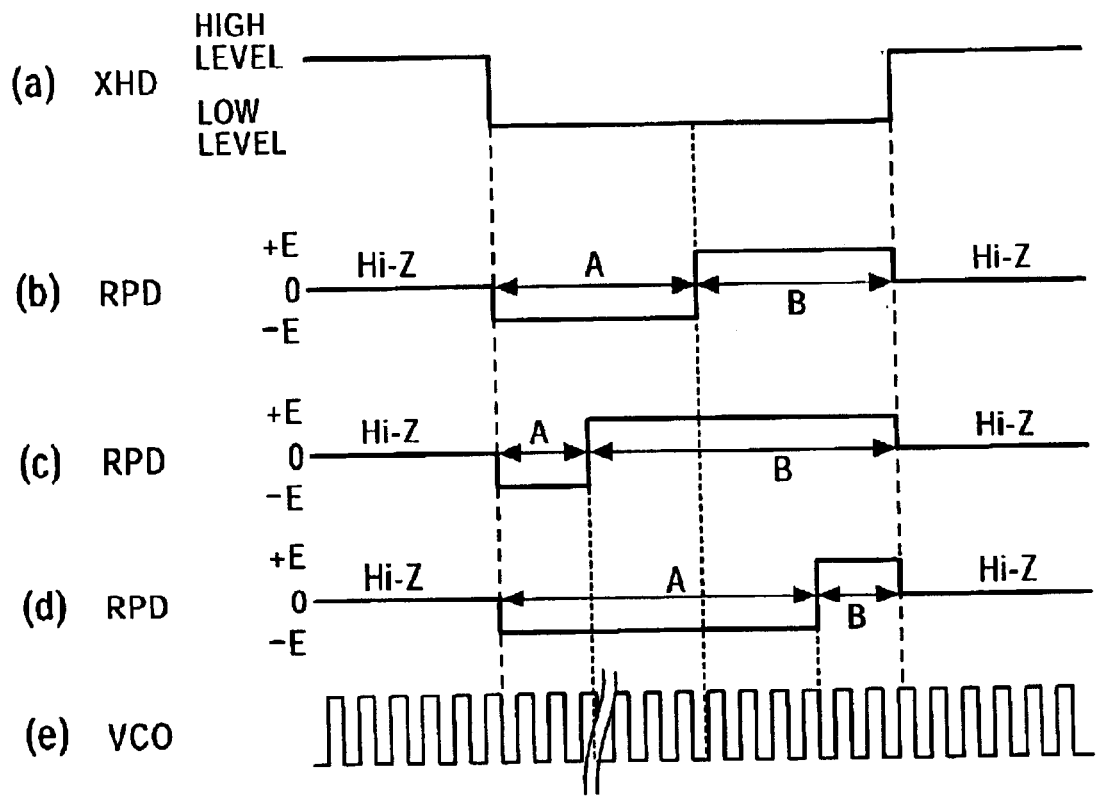
FIG. 3 is a signal chart showing the state transition of a comparison signal output from a phase comparator in the PLL circuit shown in FIG. 2.

FIG. 3 is a signal chart showing the state transition of the comparison signal RPD output from the phase comparator 26. As shown in FIG. 3, the comparison signal output from the phase comparator 26 is at any of a non-active state (high-impedance state) Hi-Z, predetermined negative potential (first state) −E, and predetermined positive potential (second state) +E. When the first input signal XHD transitions from the high level (first level) to the low level (second level), the comparison signal RPD transitions from the non-active state Hi-Z to the negative potential −E. In a period during which the first input signal XHD is at the low level, the comparison signal RPD transitions from the negative potential −E to the positive potential +E. When the first input signal XHD transitions from the low level to the high level, the comparison signal RPD transitions from the positive potential +E to the non-active state Hi-Z. The proportion of a duration of time A in which the comparison signal RPD is at the negative potential −E to a duration of time B in which the comparison signal RPD is at the positive potential +E changes depending upon the phase difference between the first input signal XHD and the second input signal HDO.

Since the LPF 28 smoothes the comparison signal RPD for output, the level of the output signal of the LPF 28 becomes low as the duration of time A increases while the duration of time B decreases. Conversely, as the duration of time A decreases while the duration of time B increases, the level of the output signal of the LPF 28 becomes high. When the durations of time A and B equal, the level of the output signal of the LPF 28 is neutral.

In the foregoing description, the high level and the low level of the first input signal XHD have been referred to as a first level and a second level, respectively; and the negative potential −E and the positive potential +E of the comparison signal RPD output from the phase comparator 26 have been referred to as a first state and a second state, respectively. However, in view of functionality, either level or state may be referred to as a first one or a second one.

Figure 4:
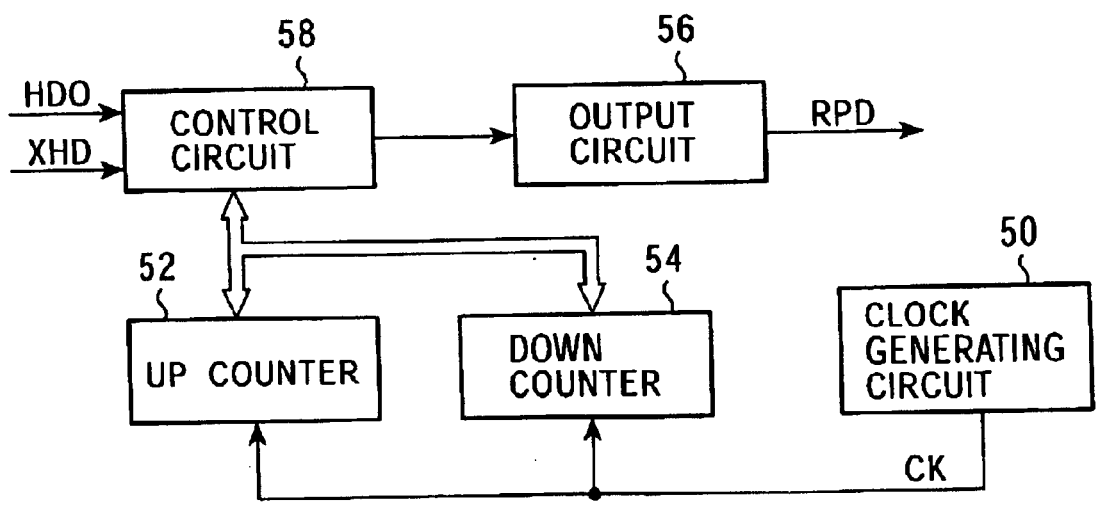
FIG. 4 is a block diagram showing a specific example of the phase comparator in the PLL circuit shown in FIG. 2.

The phase comparator 26 may be configured in any fashion as long as the comparison signal RPD output from the phase comparator 26 changes in the manner as described above. One specific example of the phase comparator 26 is shown in FIG. 4. In FIG. 4, the phase comparator 26 includes a clock generating circuit 50 for generating a clock in a period sufficiently shorter than the period of the output signal VOUT of the VCO 22, an up counter 52 for up-counting the clock output from the clock generating circuit 50, a down counter 54 for down-counting the clock output from the clock generating circuit 50, an output circuit 56 for outputting the comparison signal RPD of the phase comparator 26, and a control circuit 58 for controlling the operation of the up counter 52, the down counter 54, and the output circuit 56. The first input signal XHD and the second input signal HDO are input to the control circuit 58.

The control circuit 58 controls the counting operation of the up counter 52 and the down counter 54 in the following way.

Each time the first input signal XHD transitions from the high level to the low level, the control circuit 58 resets the up counter 52 to initialize the up count of the clock sent from the clock generating circuit 50 into zero. When the up counter 52 is reset, a half of the count value of the up counter 52 before reset is set in the down counter 54. Each time the second input signal HDO transitions from the high level to the low level, the control circuit 58 activates the down counter 54 to start the down count from the count value which was set when the up counter 52 was reset. Then, the control circuit 58 monitors the count value of the down counter 54 to specify the point at which the count value becomes zero.

The control circuit 58 controls the output circuit 56 in the following way.

When the first input signal XHD transitions from the high level to the low level, the control circuit 58 causes the comparison signal RPD of the phase comparator 26 to transition from the non-active state Hi-Z to the negative potential −E. When the count value of the down counter 54 becomes zero, the control circuit 58 causes the comparison signal RPD to transition from the negative potential −E to the positive potential +E. When the first input signal XHD transitions from the low level to the high level, the control circuit 58 causes the comparison signal RPD to transition from the positive potential +E to the non-active state Hi-Z.

Only when the phase difference between the first input signal XHD and the second input signal HDO has a predetermined magnitude, the duration of time A in which the comparison signal RPD of the phase comparator 26 is at the negative potential −E is equal to the duration of time B in which the comparison signal RPD is at the positive potential +E. When the durations of time A and B equal, the output level of the LPF 28 is neutral, and the frequency control signal supplied to the control input terminal 22a of the VCO 22 consists of the output of the DAC 36. In this case, the operation of the PLL circuit 20 is not affected by the reference signal XHD, and the frequency of the output signal VOUT of the VCO 22 therefore serves as the free-running frequency of the VCO 22.

The free-running frequency of the VCO 22 depends upon the output of the DAC 36, and therefore depends upon the value of the digital data DAC_DATA stored in the memory of the microcomputer 32. The microcomputer 32 updates the digital data DAC_DATA according to the count value of the counter 34. Thus, the free-running frequency of the VCO 22 is adjusted depending upon the number of pulses of the pulse signal VOUT output from the VCO 22 in a period in which the comparison signal RPD is at the negative potentials −E, where the pulses are counted by the counter 34. The operation of the microcomputer 32 to adjust the free-running frequency of the VCO 22 is described below with reference to the flowchart of FIG. 5 in conjunction with the signal chart of FIG. 3.

The free-running frequency of the VCO 22 is automatically adjusted during operation of the PLL circuit 20; however, the automatic adjustment is not necessarily performed in a continuous manner, and is performed at appropriate intervals. For the purpose of economy, the microcomputer 32 should not be a dedicated microcomputer having only a function as a component of the PLL circuit 20, but should be a microcomputer for controlling various functions of a display device incorporating the display panel 10. In the illustrated embodiment, the microcomputer 32 periodically launches a program for automatically adjusting the free-running frequency of the VCO 22. At the time when this auto-adjusting program for the free-running frequency is launched, the PLL circuit 20 has already been operated, and the frequency of the output signal VOUT of the VCO 22 has therefore been locked to a desired frequency that is obtained by multiplying the frequency of the reference signal XHD by the division ratio R of the divide counter 24. However, if the auto-adjusting program is not launched until the display device is powered on, generally, the free-running frequency of the VCO 22 is deviated from the above-described desired frequency. Otherwise, the elapse of time since the auto-adjusting program was last executed may introduce a change of temperature in the PLL circuit 20, thus causing the free-running frequency of the VCO 22 to be deviated from the above-described desired frequency.

If the free-running frequency of the VCO 22 is higher than a desired frequency that is obtained by multiplying the frequency of the reference signal XHD by the division ratio R of the divide counter 24, the output level of the LPF 28 is high, and the level of the frequency control signal input to the VCO 22 is therefore high, thus preventing the phase difference between the first input signal XHD and the second input signal HDO from being reduced. Then, as indicated in (c) of FIG. 3, the duration of time A in which the comparison signal RPD output from the phase comparator 26 is at the negative potential −E is short while the duration of time B in which the comparison signal RPD is at the positive potential +E is long.

On the other hand, if the free-running frequency of the VCO 22 is lower than the above-described desired frequency, the output level of the LPF 28 is low, and the level of the frequency control signal input to the VCO 22 is therefore low, thus preventing the phase difference between the first input signal XHD and the second input signal HDO from increasing. Then, as indicated in (d) of FIG. 3, the duration of time A is long while the duration of time B is short.

If the free-running frequency of the VCO 22 is equal to the above-described desired frequency, then, as indicated in (b) of FIG. 3, the durations of time A and B equal, and the output level of the LPF 28 is neutral. Thus, the frequency of the output signal VOUT of the VCO 22 serves as the free-running frequency.

The number of pulses of the pulse signal VOUT output from the VCO 22 in a period in which the comparison signal RPD of the phase comparator 26 is at the negative potential −E (hereinafter referred to as "count value N"), where the pulses are counted by the counter 34, varies depending upon the duration of time A in which the comparison signal RPD is at the negative potential −E. In order to evaluate the count value N, the value of the number of pulses of the pulse signal VOUT when the durations of time A and B equal (hereinafter referred to as "reference count value N0") is stored in the memory of the microcomputer 32 in advance.

Figure 5:
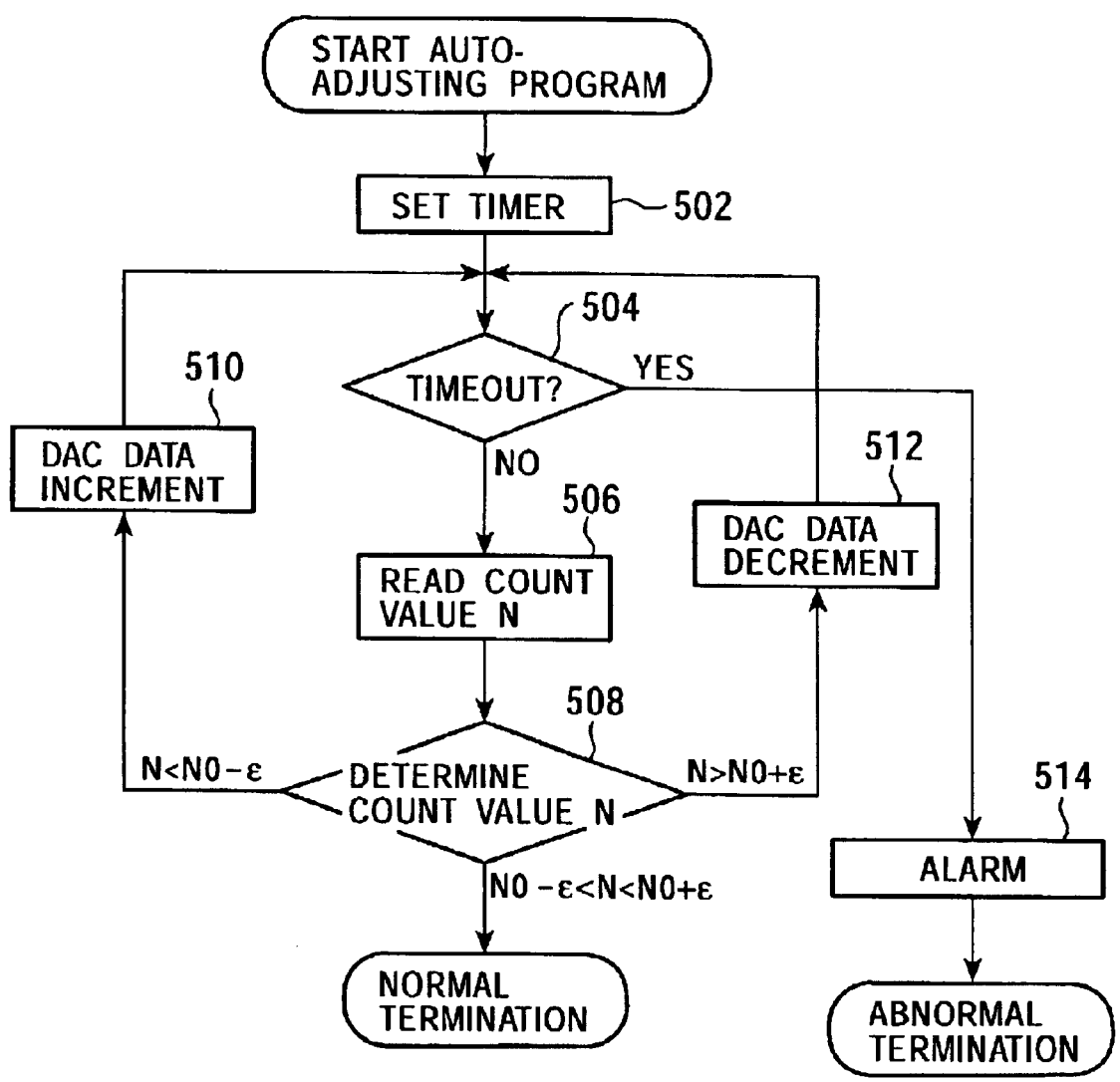
FIG. 5 is a flowchart showing a data updating algorithm executed by a microcomputer in the PLL circuit shown in FIG.

Referring to FIG. 5, when the auto-adjusting program for the free-running frequency starts, the microcomputer 32 first sets a timer so as to start counting from zero (block 502). Then, it is determined whether or not the value of the timer exceeds a predetermined value (block 504). The timer indicates an elapsed time since the auto-adjusting program started. The microcomputer 32 reads the value of the timer to check the elapsed time, and determines a timeout or not. The first time the program routine proceeds from block 502 to block 504, that is, immediately after the timer was set, a negative determination is obtained in block 504, and the program routine proceeds to block 506.

In block 506, the microcomputer 32 controls the counter 34 so as to count the number of pulses of the pulse signal VOUT output from the VCO 22 in a period in which the comparison signal RPD of the phase comparator 26 is at the negative potential −E, and reads the count value N.

In block 508, the microcomputer 32 compares the read count value N with the reference count value N0. If the difference between the count value N and the reference count value N0 is within a predetermined allowance (N0−□<N <N0+□), this means that the free-running frequency of the VCO 22 is adjusted to the desired frequency range, i.e., a frequency range sufficiently similar to the frequency obtained by multiplying the frequency of the reference signal XHD by the division ratio R of the divide counter 24. Then, the microcomputer 32 terminates the auto-adjusting program. This indicates a normal termination.

On the other hand, if the difference between the count value N and the reference count value N0 does not fall within the predetermined allowance, when the count value N is smaller than the reference count value N0 (N<N0−□), this means that the free-running frequency of the VCO 22 is too high, in which case the comparison signal RPD of the phase comparator 26 indicated in (c) of FIG. 3 is exhibited. Then, the microcomputer 32 causes the value of the digital data DAC_DATA to increment (block 510) so that the free-running frequency of the VCO 22 decreases.

If the difference between the count value N and the reference count value N0 does not fall within the predetermined allowance, when the count value N is greater than the reference count value N0 (N>N0+□), this means that the free-running frequency of the VCO 22 is too low, in which case the comparison signal RPD of the phase comparator 26 indicated in (d) of FIG. 3 is exhibited. Then, the microcomputer 32 causes the value of the digital data DAC_DATA to decrement (block 512) so that the free-running frequency of the VCO 22 increases.

As used herein, if the value of the digital data DAC_DATA is designated by "O", both the two separate processings identified by blocks 510 and 512 are expressed by O=O+(N0−N)×K, where K denotes the correction coefficient.

The program routine loops back to block 504 from both block 510 and block 512, and it is determined again whether or not the value of the timer exceeds the predetermined value, as described above, to determine a timeout or not. Even when the auto-adjusting program continues with the PLL circuit 20 or any relevant circuit failed, if the free-running frequency of the VCO 22 does not reach the desired frequency range, the value of the timer exceeds the predetermined value during the loop of the program routine. Then, the program routine proceeds to block 514 from block 504, in which an abnormal termination is alarmed, and the program routine ends. If the automatic adjustment for the free-running frequency of the VCO 22 is not completed after a predetermined time elapses since the auto-adjusting program started, therefore, the auto-adjusting program is brought into an abnormal termination, thus preventing the auto-adjusting process from persistently looping back to affect any function of the microcomputer 32. The abnormal termination of the program also enables any defected device to be detected.

What is claimed is:

1. A phase locked loop circuit comprising:
   a voltage controlled oscillator having a control input terminal which outputs a pulse signal having a frequency depending upon a frequency control signal supplied to the control input terminal;
   a divide counter for dividing the pulse signal received from the voltage controlled oscillator to output the resulting pulse signal;
   a phase comparator which receives as a first input signal a reference signal which is a pulse signal having a predetermined frequency supplied from an external unit and receives as a second signal the pulse signal output from the divide counter, and which outputs a comparison signal, a period in which the comparison signal is at a predetermined level changing depending upon the phase difference between the first input signal and the second input signal;
   counting means for counting the number of pulses of the pulse signal output from the voltage controlled oscillator in a period during which the comparison signal of the phase comparator is at the predetermined level;
   data storing and updating means for updating stored digital data based on the count value of the counting means;
   a digital-to-analog converter for converting the digital data stored in the data storing and updating means into an analog signal to output the analog signal;
   a low-pass filter for smoothing the comparison signal received from the phase comparator to output the resulting signal; and
   a combiner for combining the output of the low-pass filter and the output of the digital-to-analog converter to generate a frequency control signal which is supplied to the control input terminal of the voltage controlled oscillator, wherein the digital data is updated by the data storing and updating means, thus allowing the free-running frequency of the voltage controlled oscillator to be automatically adjusted.

2. A phase locked loop circuit according to claim 1, wherein the comparison signal output from the phase comparator is at any of a non-active state, a first state, and a second state;

(a) when the first input signal transitions from a first level to a second level, the comparison signal output from the phase comparator transitions from the non-active state to the first state, (b) in a period during which the first input signal is at the second level, the comparison signal output from the phase comparator transitions from the first state to the second state, and (c) when the first input signal transitions from the second level to the first level, the comparison signal output from the phase comparator transitions from the second state to the non-active state; and (d) a duration of time in which the comparison signal output from the phase comparator is at the first state and a duration of time in which the comparison signal output from the phase comparator is at the second state change depending upon the phase difference between the first input signal and the second input signal.

3. A phase locked loop circuit according to claim 1, wherein the data storing and updating means includes a microcomputer, and the counting means includes said microcomputer and a counter controlled by said microcomputer.

4. A phase locked loop circuit according to claim 1, wherein the pulse signal output from the divide counter is a master clock of a display driving circuit of a display device.

* * * * *